(12) United States Patent
Smith

(10) Patent No.: US 11,335,581 B2
(45) Date of Patent: May 17, 2022

(54) SYSTEM AND METHOD FOR ADHERING A SEMICONDUCTIVE WAFER TO AN ELECTROSTATIC CARRIER BY ADJUSTING RELATIVE PERMITTIVITY

(71) Applicant: Eryn Smith, Danville, CA (US)

(72) Inventor: Eryn Smith, Danville, CA (US)

( * ) Notice: Subject to any disclaimer, the term of this patent is extended or adjusted under 35 U.S.C. 154(b) by 1 day.

(21) Appl. No.: 16/985,141

(22) Filed: Aug. 4, 2020

(65) Prior Publication Data

US 2021/0035845 A1 Feb. 4, 2021

Related U.S. Application Data

(63) Continuation-in-part of application No. 29/700,100, filed on Jul. 31, 2019, now Pat. No. Des. 913,256.

(51) Int. Cl.
*H01L 21/683* (2006.01)
(52) U.S. Cl.
CPC ................. *H01L 21/6833* (2013.01)
(58) Field of Classification Search
CPC ........... H01L 21/6833; H01L 21/67346
See application file for complete search history.

(56) References Cited

U.S. PATENT DOCUMENTS

| 2016/0336210 A1* | 11/2016 | Cooke | H01L 21/6833 |
| 2016/0379862 A1* | 12/2016 | Smith | H01L 21/67092 |
| | | | 156/273.1 |
| 2017/0291856 A1* | 10/2017 | Sun | C23C 4/11 |

* cited by examiner

*Primary Examiner* — Thienvu V Tran
*Assistant Examiner* — Bart Iliya

(57) ABSTRACT

A mobile electrostatic carrier (MESC) provides a structural platform to temporarily bond a semiconductive wafer and can be used to transport the semiconductive wafer or be used to perform manufacturing processes on the semiconductive wafer. The MESC uses a plurality of electrostatic field generating (EFG) circuits to generate electrostatic fields across the MESC that allow the MESC to bond to compositional impurities within the semiconductive wafer. A dielectric thin film is superimposed across the bonding surface of MESC in order to adjust the relative permittivity between the semiconductive wafer to the MESC. This adjustment in the relative permittivity allows the MESC to further adhere the semiconductive wafer to the MESC.

11 Claims, 11 Drawing Sheets

SYSTEM AND METHOD FOR ADHERING A SEMICONDUCTIVE WAFER TO AN ELECTROSTATIC CARRIER BY ADJUSTING RELATIVE PERMITTIVITY

The current application is a continuation-in-part (CIP) application of the U.S. non-provisional application serial number 29/700,100 filed on Jul. 31, 2020.

FIELD OF THE INVENTION

The present invention relates generally to a system and method for optimizing rare earth films to match or tune the relative permittivity ($\varepsilon_r$) of an electrostatic carrier used for attaching a semiconductor wafer during manufacturing. More specifically, the present invention is a method and apparatus for a creating such a tuned wafer

BACKGROUND OF THE INVENTION

With the advent of new technology, people are more reliant on electronic devices/systems in their daily routine. This causes an increase in manufacturing and producing of electronic devices and systems. Manufacturing of smaller and smaller end user products has driven the semiconductor manufactures to continually decrease the size and power consumption of semiconductors.

The continued decrease in device size has caused a variety of challenges to the manufacturer; semiconductive wafers have become thinner and more fragile. Care must be taken when moving and processing these semiconductive wafers during fabrication. Utilizing electrostatic carriers has shown to help mitigate many of the problems related to handling and processing new generation wafers and substrates.

Thus, an objective of the present invention is attaching a whole semiconductive wafer to an electrostatic carrier and tuning a rare earth thin film to greatly increase the bonding strength of the electrostatic carrier. A rare earth thin film can be made of any of the 17 rare earth elements 17, which include the 15 lanthanides, Scandium (Sc), and Yttrium (Y). Experimental investigation has been conducted on Y, Neodymium (Nd) with some work on Hafnium (Hf) and oxides or fluorides of these commonly known in the art.

In terms of electromagnetism, permittivity stands out as the way of measuring the level of resistance that is experienced whenever developing an electrical field inside a medium. In other words, permittivity ($\varepsilon$) can be described as the calculation associated with exactly how an electric field influences and is particularly impacted by some sort of dielectric medium. The permittivity associated with a medium identifies exactly how much electric field (more properly known as "flux") is 'generated' by every unit charge in this medium. A lot more electric flux is available inside a medium having a reduced permittivity (for every unit charge) as a consequence of polarization influences. Permittivity is proportional to electrical vulnerability, which is a way of measuring exactly how conveniently does a dielectric polarizes in response to an electrical field. Therefore, permittivity pertains to some sort of material's capacity to withstand an electrical field. Another objective of the present invention is to optimize or "tune" a thin film and apply it to an electrostatic carrier to greatly increase the bonding strength of the present invet.

In standard international (SI) units, permittivity ($\varepsilon$) is assessed in farads per meter (F/m or $Fm^{-1}$) whereas electric susceptibility is dimensionless. The present invention is focused around relative permittivity ($\varepsilon_r$) as electric susceptibility and permittivity are associated to each other. Permittivity could be of different types depending upon the instances where the electric field is being considered. Vacuum permittivity ($\varepsilon_o$), which is also known as the permittivity of the free space, has fixed value. The permittivity of a dielectric medium is often represented by the ratio of its absolute permittivity to the electric constant. This dimensionless quantity is called the medium's relative permittivity ($\varepsilon_r$) or dielectric constant ($\kappa$). Moreover, relative permittivity is directly related to electric susceptibility ($\chi$), which is a measure of how easily a dielectric polarizes in response to an electric field, given by "$\chi=\kappa-1$", otherwise given by "$\varepsilon=\varepsilon_r\varepsilon_o=(1+\chi)\varepsilon o$".

DETAILED DESCRIPTION OF THE INVENTION

All illustrations of the drawings are for the purpose of describing selected versions of the present invention and are not intended to limit the scope of the present invention.

Figure 1:
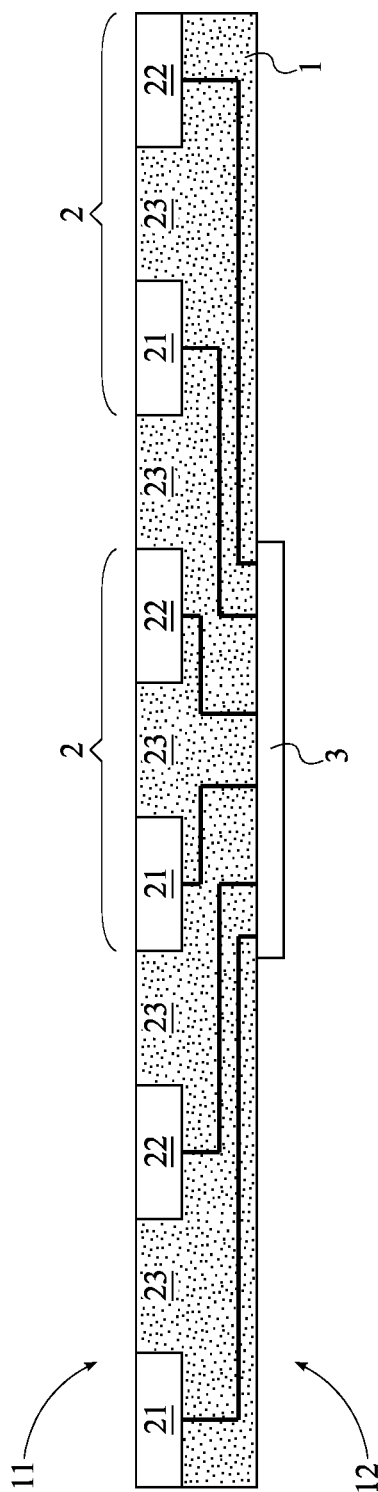
FIG. 1 is a schematic view of the major components of a mobile electrostatic carrier (MESC).
Figure 4:
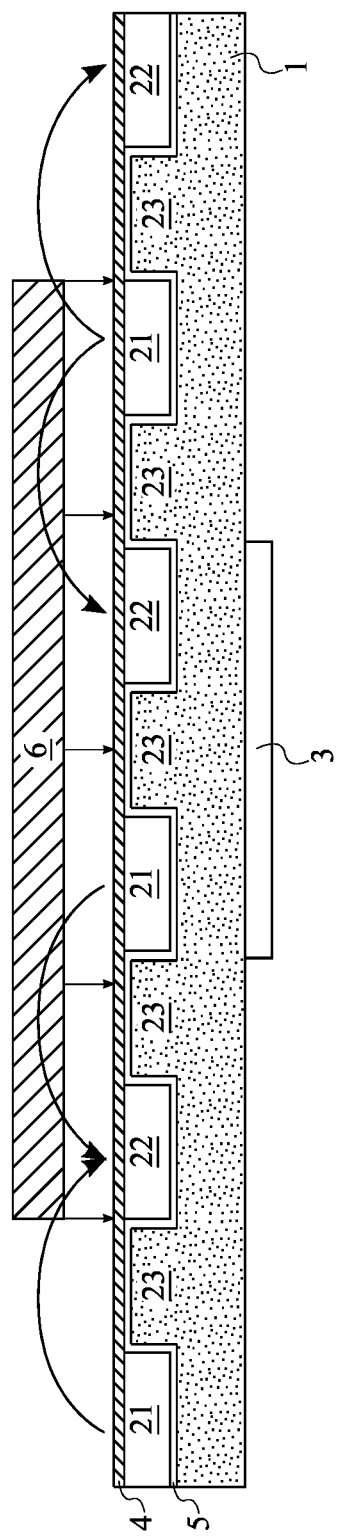
FIG. 4 is a side schematic view of the MESC implementing an electrostatic field to bond a semiconductive wafer to the MESC.
Figure 5:
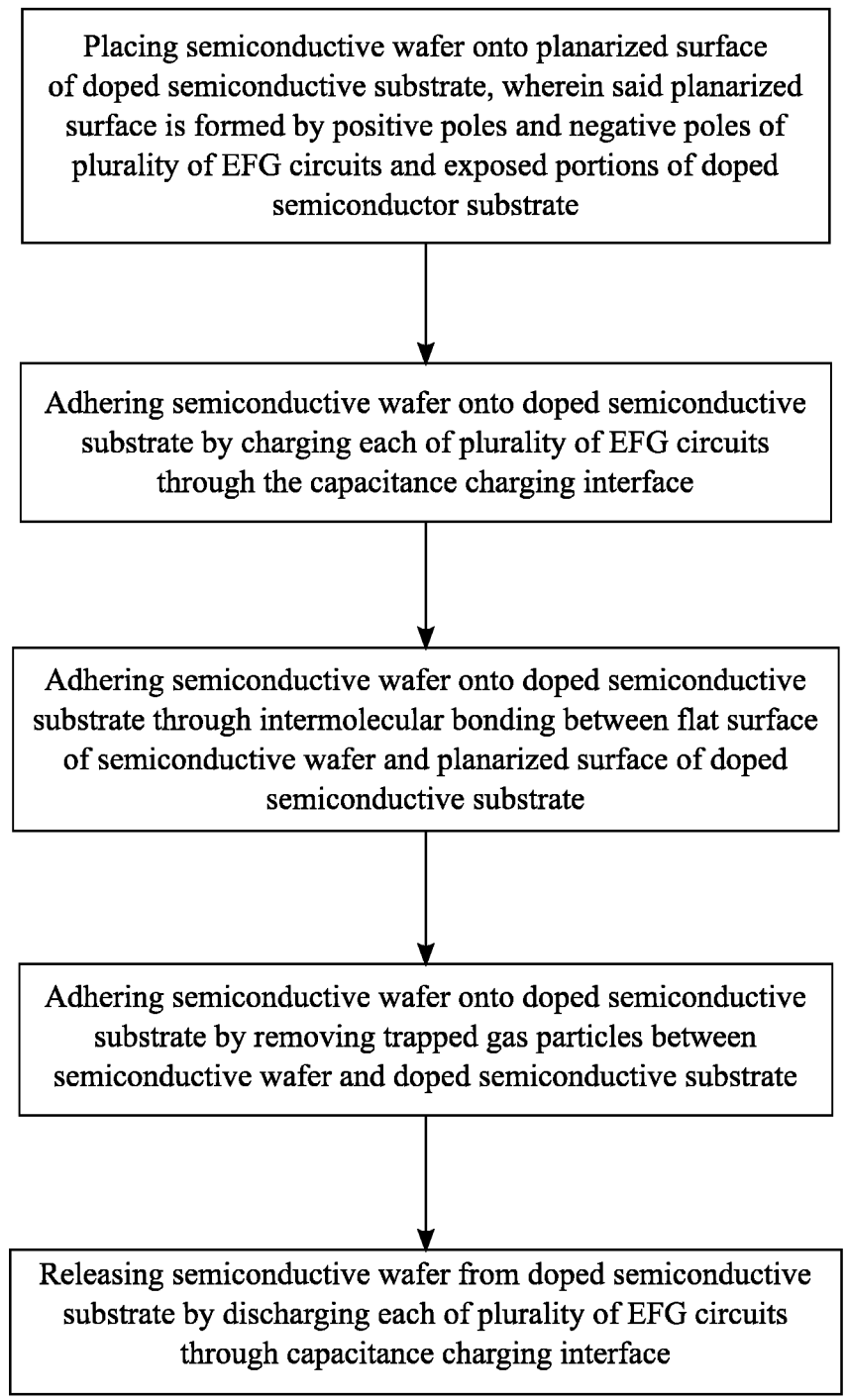
FIG. 5 is a flowchart illustrating how three modes of adhesion are used to bond the semiconductive wafer to the MESC.

As can be seen in FIGS. 1 and 4, the present invention is a mobile electrostatic carrier (MESC) that is used to handle and transport semiconductive wafers or coupons because of the thin, flimsy nature of these wafers or coupons. Different modes of adhesion are used to hold a semiconductive wafer upon the present invention, which outlined in FIG. 5. In addition, the present invention can be used to bond and carry many different sizes of semiconductive wafers or coupons. The MESC comprises a doped semiconductive substrate 1, a plurality of electrostatic field generating (EFG) circuits 2, and a capacitance charging interface 3. The doped semiconductive substrate 1 is used as a base to connect the other components of the present invention together and allows for a semiconductive wafer 6 to be properly situated upon the present invention. The doped semiconductive substrate 1 is either made of a p-type semiconductor material or an n-type semiconductor material that is used in combination with the plurality of EFG circuits 2 in order to generate a non-uniform electrostatic field, which is used to bond the semiconductive wafer 6 to the present invention. The plurality of EFG circuits 2 is distributed across the doped semiconductive substrate 1 so that a semiconductive wafer 6 can be adhered anywhere across the doped semiconductive substrate 1. The capacitance charging interface 3 is used to selectively charge or discharge the doped semiconductive substrate 1 and the plurality of EFG circuits 2. Essentially, the capacitance charging interface 3 is used to turn on or to turn off the non-uniform electrostatic field.

One mode of adhesion implemented by the present invention is the non-uniform electrostatic field that is generated by the plurality of EFG circuits 2. Each of the plurality of EFG circuits 2 comprises a positive pole 21, a negative pole 22, and a biased pole 23. The positive pole 21 and the negative pole 22 are antennas that are respectively provided with a positive charge and a negative charge, which generates an electrostatic field from the positive pole 21 to the negative pole 22. These antennas are designed to be highly resistive so that each antenna is able to hold a larger charge and, thus, is able to increase the capacitance between the positive pole 21 and the negative pole 22. The electrostatic field generated by each of the plurality of EFG circuits 2 will be used to hold a semiconductive wafer 6 on the doped semiconductive substrate 1. For the present invention, the plurality of EFG circuits 2 will apply a greater bonding energy on materials with a lower resistivity. Conceptually, materials with a lower resistivity have more impurities, and the electrostatic field lines emanating from the plurality of EFG circuits 2 can more easily grasp onto these impurities. For example, semiconductive materials such as aluminum have a relatively large amount of impurities, and, thus, the plurality of EFG circuits 2 can more easily bond with aluminum. However, pure materials such as quartz, sapphire, or diamond have a relatively small amount of impurities, and, thus, the plurality of EFG circuits 2 cannot easily bond to these pure materials.

When a semiconductive wafer 6 is being held by the present invention, the semiconductive wafer 6 is situated upon a first face 11 of the doped semiconductive substrate 1. Consequently, the positive pole 21 and the negative pole 22 are embedded in the doped semiconductive substrate 1 from the first face 11 so that the electrostatic field produced by the positive pole 21 and the negative pole 22 can interact with the semiconductive wafer 6. The positive pole 21 and the negative pole 22 are offset from each other across the first face 11 by a specified gap, which spans across an exposed portion of the doped semiconductive substrate 1. The exposed portion is used as the biased pole 23 for each of the plurality of EFG circuits 2. Moreover, the bonding strength of the electrostatic field is proportionately dependent on the capacitance between the positive pole 21 and the negative pole 22. The present invention can increase the capacitance between the positive pole 21 and the negative pole 22 by using the doped semiconductive substrate 1 itself and the biased pole 23, and, thus, the present invention can increase the bonding strength of the electrostatic field. When the biased pole 23 is either positively or negatively charged by the capacitance charging interface 3, the doped semiconductive substrate 1 produces an enrichment or depletion zone within the semiconductive wafer 6, each of which is located adjacent to the biased pole 23 and is located in between the positive pole 21 and the negative pole 22. The location of the enrichment or depletion zone allows the present invention to adjust the capacitance between the positive pole 21 and the negative pole 22. Thus, the present invention can adjust the dielectric properties of the semiconductive wafer 6 through the creation of the enrichment or depletion zone. For example, the enrichment or depletion zone can be used to increase the dielectric constant and, in turn, increase the capacitance between the positive pole 21 and the negative pole 22. This increase in capacitance between the positive pole 21 and the negative pole 22 creates a stronger bonding force between the semiconductive wafer 6 and the present invention.

Figure 3:
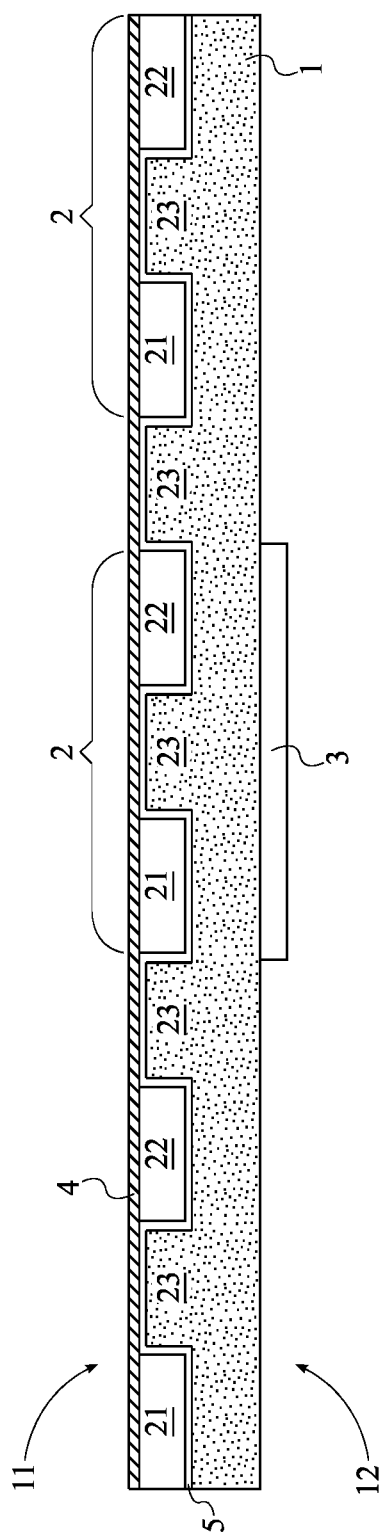
FIG. 3 is a side schematic view of the MESC with the insulative film and the polishing film.

The size of the specified gap between the positive pole 21 and the negative pole 22 is determined by two factors: the size of semiconductive wafers being carried by the present invention and the operational voltage range of the present invention. The size of the semiconductive wafers determines the size of the specified gap because the present invention can grasp a smaller semiconductive wafer with a smaller specified gap between the positive pole 21 and the negative pole 22. However, a smaller specified gap would more likely cause a corona discharge between the positive pole 21 and the negative pole 22. The operational voltage range of the present invention also determines the size of the specified gap because the present invention can more securely grasp a semiconductive wafer with a higher operational voltage range. However, a higher operational voltage range would more likely cause a corona discharge between the positive pole 21 and the negative pole 22. The present invention should be designed to adequately grasp the semiconductive wafers without causing a corona discharge by selecting the appropriate size for the specified gap and by selecting the appropriate operational voltage for the present invention. Thus, the appropriate size for the specified gap and the appropriate operational voltage are also chosen to accommodate a specific size or kind of semiconductive wafer. In addition, an insulative film 5 shown in FIG. 3 is positioned between the positive pole 21 and the doped semiconductive substrate 1 and is positioned between the negative pole 22 and the doped semiconductive substrate 1, which prevents an electrical current from passing from the negative pole 22, through an exposed portion of the doped semiconductive substrate 1, and to the positive pole 21. In one embodiment of the present invention, the doped semiconductive substrate 1 is made of silicon, which is oxidized on the outer surface in order to form the insulative film 5.

A second mode of adhesion implemented by the present invention is a dipole-dipole bonding between flat surfaces of the present invention and the semiconductive wafer 6. In order to implement this mode of adhesion for the present invention, the positive poles 21 and the negative poles 22 need to be flush with the exposed portions of the doped semiconductive substrate 1. Consequently, a planarized surface is formed by the positive poles 21 and the negative poles 22 of the plurality of EFG circuits 2 and the exposed portions of the doped semiconductive substrate 1. This kind of intermolecular bonding needs to occur between the planarized surface of the doped semiconductive substrate 1 and a flat surface of the semiconductive wafer 6. In addition, a polishing film 4 shown in FIG. 3 is superimposed upon the planarized surface in order to enhance the dipole-dipole bonding between the present invention and the semiconductive wafer 6. The polishing film 4 is also used as an insulator that further prevents corona discharge from the positive pole 21 to the negative pole 22.

A third mode of adhesion implemented by the present invention is to remove trapped gas particles between the semiconductive wafer 6 and the doped semiconductive substrate 1 in order to form a better intermolecular bond between the planarized surface of the doped semiconductive substrate 1 and a flat surface of the semiconductive wafer 6. In order to implement this mode of adhesion for the present invention, the semiconductive wafer 6 is bonded to the present invention placed into a kind of vacuum chamber. Once the vacuum chamber is activated, the trapped gas particles are exhausted from the space between the semiconductive wafer 6 and the doped semiconductive substrate 1.

Figure 7:
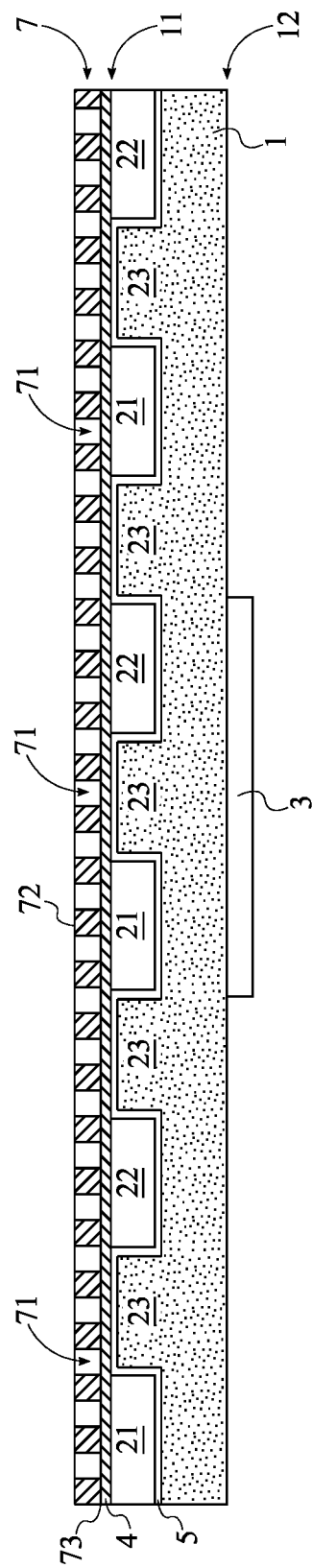
FIG. 7 is a side schematic view of the MESC with the insulative film, the polishing film, and the layer of patterned material.
Figure 8:
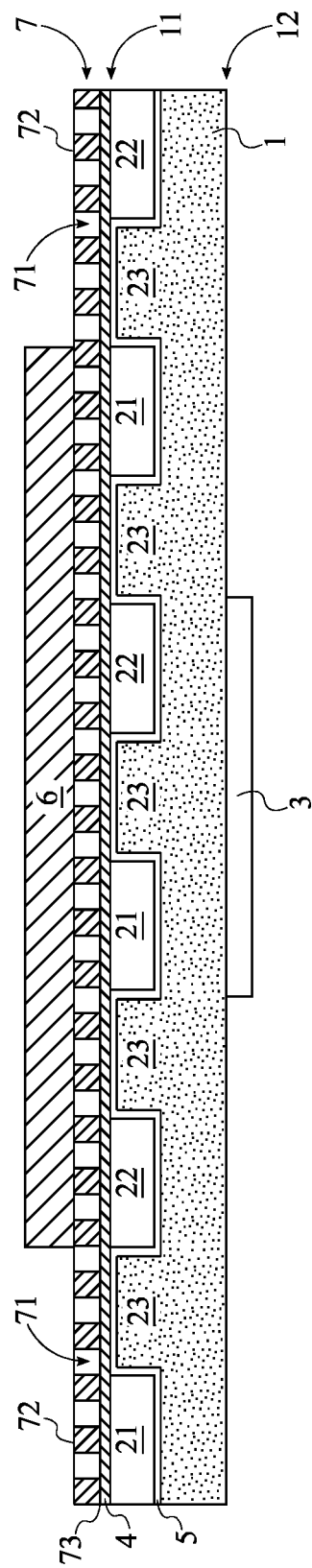
FIG. 8 is a side schematic view of the MESC implementing a vacuum seal with each cavity of the layer of patterned material to further bond the semiconductive wafer to the MESC.

A fourth mode of adhesion implemented by the present invention uses a layer of patterned material 7 in order to further adhere the semiconductive wafer 6 onto the MESC with a vacuum, which can be seen in FIG. 8. The fourth mode of adhesion is useful to create a hermetic seal between the semiconductive wafer 6 and the bonding surface of the MESC so that when the semiconductive wafer 6 is put through any kind of manufacturing process involving liquids, the liquid is not able to migrate in between the semiconductive wafer 6 and the bonding surface of the MESC and is not able to disrupt the manufacturing process. The fourth mode of adhesion also allows for the hermetic seal between the semiconductive wafer 6 and the bonding surface of the MESC to withstand high shear loads. The layer of patterned material 7 is preferably a polymer and is superimposed onto the bonding surface of the MESC. The layer of patterned material 7 comprises an exposed surface 72, an unexposed surface 73, and a plurality of cavities 71, which are shown in FIG. 7. The exposed surface 72 allows the semiconductive wafer 6 to be situated upon the layer of patterned material 7, and the unexposed surface 73 is situated upon the bonding surface of the MESC. Each of the plurality of cavities 71 is used to generate a micro-vacuum that allows the present invention to further adhere the semiconductive wafer 6 onto the MESC. The plurality of cavities 71 is distributed across the layer of patterned material 7 so that the layer of patterned material 7 is able to provide additional adhesion force across the entire bonding surface of the MESC. Each of the plurality of cavities 71 traverses into the layer of patterned material 7 from the exposed surface 72 towards the unexposed surface 73, which properly orients the adhesion force from the micro-vacuum generated by each of the plurality of cavities 71. The fourth mode of adhesion is an improvement over the third mode of adhesion for the present invention because the fourth mode of adhesion simply relocates any trapped gas particles in between the semiconductive wafer 6 and the bonding surface of the MESC into the plurality of cavities 71.

Figure 9:
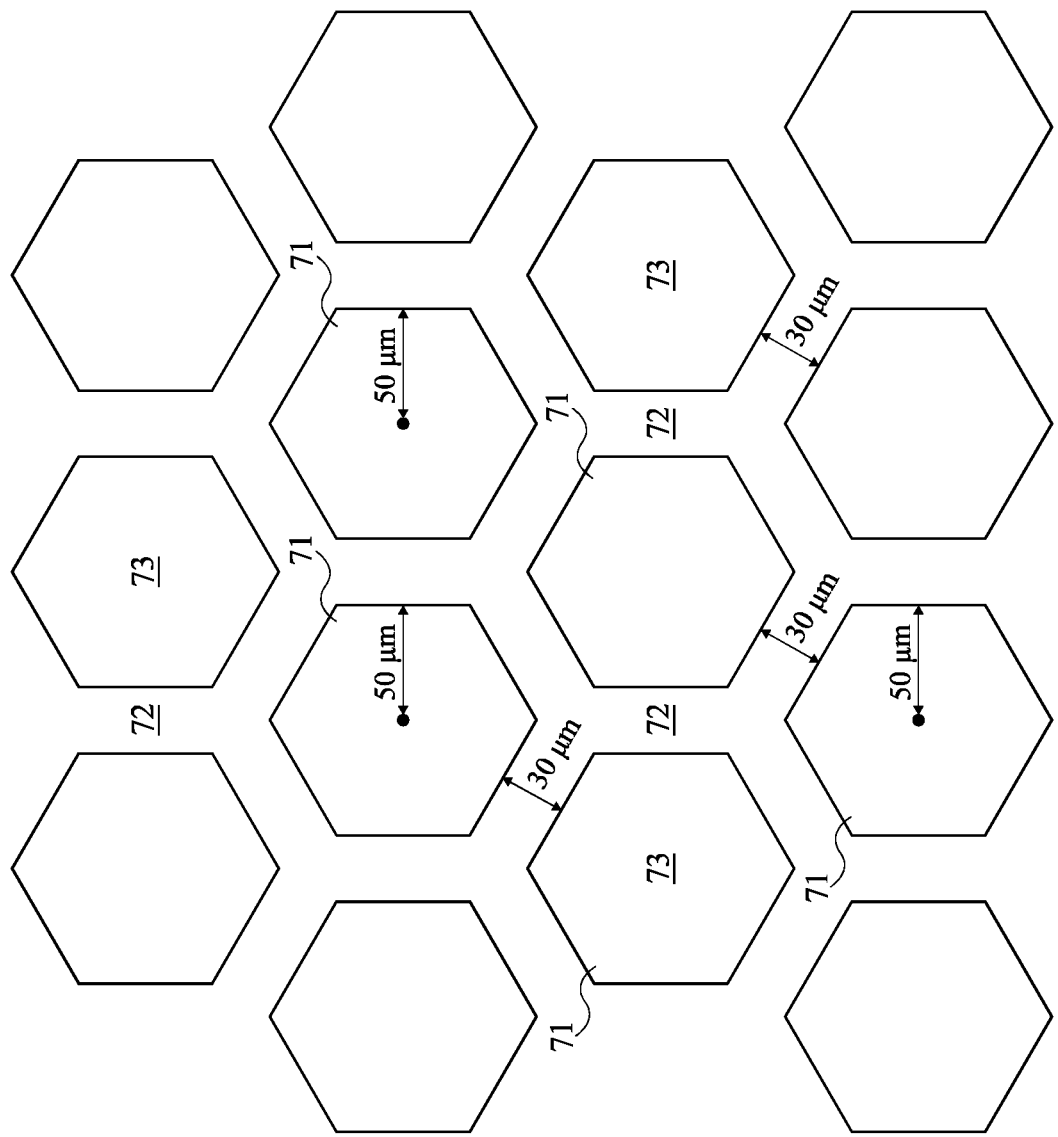
FIG. 9 is a top schematic view for the layer of patterned material, wherein the layer of patterned material is configured into a honeycomb-shaped structure.

In preferred embodiment of the present invention shown in FIG. 9, the cross-section for each of the plurality of cavities 71 is a regular hexagonal shape, which allows the layer of patterned material 7 to emulate a honeycomb-shaped structure. More specifically, an apothem of the regular hexagonal shape is 50 micrometers, and each of the plurality of cavities 71 is offset amongst each other by a 30-micrometer gap, which are the optimal dimensions for the layer of patterned material 7. However, the layer of patterned material 7 can be designed with different dimensions and still be fully functional. Also in the preferred embodiment of the present invention, each of the plurality of cavities 71 traverses all the way through the layer of patterned material 7 from the exposed surface 72, through the unexposed surface 73, and to the bonding surface of MESC. However, in some embodiments of the present invention, each of the plurality of cavities 71 may only partially traverse into the layer of patterned material 7 without reaching the bonding surface of the MESC.

One method of manufacturing the layer of patterned material 7 onto the bonding surface of the MESC needs the layer of patterned material 7 to be made of a photosensitive material. First, a uniform layer of the photosensitive material is applied to the bonding surface of the MESC. Second, the layer of photosensitive material is then exposed with a masking pattern so that the plurality of cavities 71 burrows through the uniform layer of photosensitive material in order to create the layer of patterned material 7.

Figure 10:
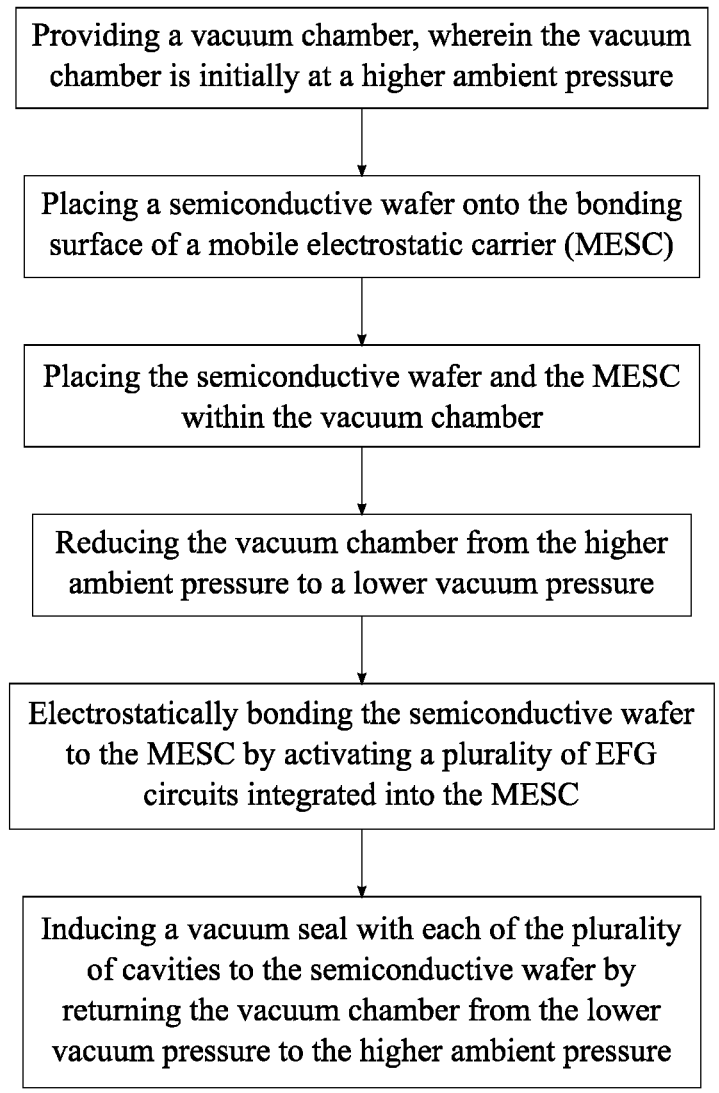
FIG. 10 is flowchart illustrating how to induce the vacuum seal with each cavity of the layer of patterned material through the use of a vacuum chamber.

In order for the fourth mode of adhesion to be actuated for the present invention, the following procedure outlined in FIG. 10 needs to be implemented with the MESC, the layer of patterned material 7, and a vacuum chamber. The vacuum chamber is able to hermetically seal off itself and lower its internal pressure to a near vacuum. Before the vacuum chamber hermetically seals off itself, the vacuum chamber is initially at a higher ambient pressure. The procedure begins by placing the semiconductive wafer 6 onto the bonding surface of the MESC and then placing the semiconductive wafer 6 and the MESC within the vacuum chamber. After the vacuum chamber is hermetically seals off itself, the procedure continues by reducing the vacuum chamber from the higher ambient pressure to the lower vacuum pressure, which extracts the gas retained within each of the plurality of cavities 71. The semiconductive wafer 6 is then electrostatically bonded to the MESC by activating the plurality of EFG circuits 2 for the present invention so that each of the plurality of cavities 71 is hermetically sealed by the semiconductive wafer 6 pressing against the layer of patterned material 7. Finally, a vacuum seal with each of the plurality of cavities 71 is induced by returning the vacuum chamber from the lower vacuum pressure to the higher ambient pressure, which allows the semiconductive wafer 6 to be further adhered to the MESC through a vacuum.

Figure 11:
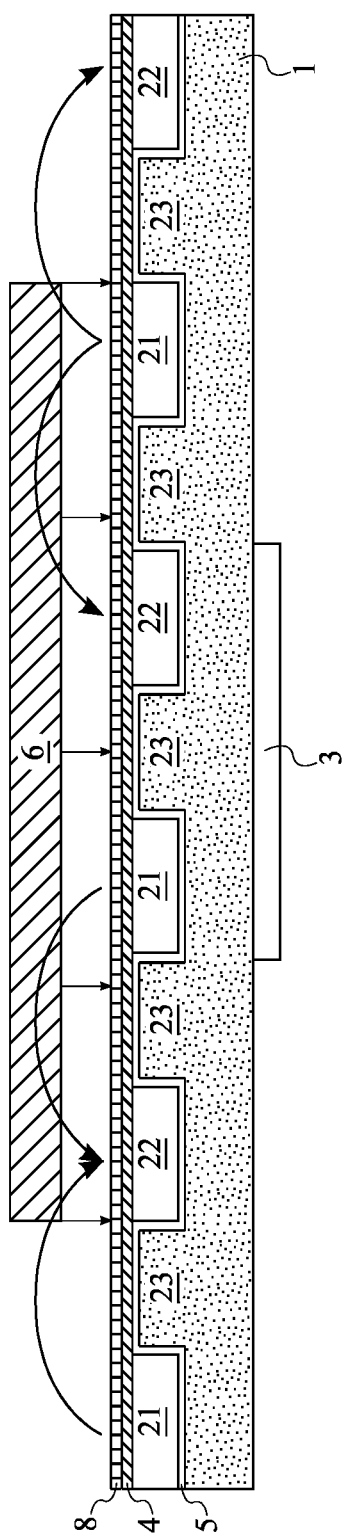
FIG. 11 is a side schematic view of the MESC with the insulative film, the polishing film, and the dielectric thin film, wherein the MESC is implementing an electrostatic field to bond a semiconductive wafer to the MESC.

As can be seen in FIG. 11, a fifth mode of adhesion implemented by the present invention uses a dielectric thin film 8 in order to further adhere the semiconductive wafer 6 onto an electrostatic carrier, which is a generic version of the MESC. The dielectric thin film 8 is used to adjust the relative permittivity between the semiconductive wafer 6 and the electrostatic carrier in order to optimize the bonding force between the semiconductive wafer 6 and the electrostatic carrier. The dielectric thin film 8 is superimposed onto a bonding surface of the electrostatic carrier, which allows the dielectric thin film 8 to be a capstone layer for the electrostatic carrier and therefore allows the dielectric thin film 8 to be an interface between the electrostatic carrier and the semiconductive wafer 6. The dielectric thin film 8 is made of a non-stoichiometric rare-earth compound because the chemical properties of the non-stoichiometric rare-earth compound facilitates adjustment of the relative permittivity between the semiconductive wafer 6 and the electrostatic carrier. The non-stoichiometric rare-earth compound is preferably deposited onto the bonding surface of the electrostatic carrier through an ion-deep-deposition delivery method. However, the non-stoichiometric rare-earth compound can alternatively be deposited onto the bonding surface of the electrostatic carrier through a plasma-spray delivery method, a vapor-phase-evaporation delivery method, a chemical-vapor-deposition delivery method, or other kinds of delivery methods.

More specifically, if the electrostatic carrier is configured as the aforementioned MESC, then the dielectric thin film 8 can be configured to tune capacitance between the positive pole 21, the negative pole 22, and the biased pole 23. Tuning for an increase in capacitance between the positive pole 21, the negative pole 22, and the biased pole 23 allows for a stronger bonding force between the semiconductive wafer 6 and the MESC. In other words, the dielectric thin film 8 tunes an electric field emanating amongst the positive pole 21, the negative pole 22, and the biased pole 23 in accordance to Coulomb's law. In addition, a thickness of the dielectric thin film 8 can be configured to proportionately tune the capacitance between the positive pole 21, the negative pole 22, and the biased pole 23. This is because the relative permittivity between the semiconductive wafer 6 and the MESC increases/decreases with the thickness of the dielectric thin film 8, and the capacitance between the positive pole 21, the negative pole 22, and the biased pole 23 increases/decreases with the relative permittivity between the semiconductive wafer 6 and the MESC.

Furthermore, the dielectric thin film 8 can be configured with different specifications to better adjust the relative permittivity between the semiconductive wafer 6 and the electrostatic carrier. One specification is that the non-stoichiometric rare-earth compound is an yttrium compound, which can be, but is not limited to, yttrium oxide ($Y_2O_3$), yttrium fluoride ($YF_3$), yttria-stabilized zirconia (YSZ). Another specification is that the non-stoichiometric rare-earth compound is an oxidized compound, which can be, but is not limited to, $Y_2O_3$, zirconium oxide ($ZrO_2$), or strontium oxide (SrO). Alternatively, the non-stoichiometric rare-earth compound is an fluoridized compound, which can be, but is not limited to, $YF_3$. Another specification is that a thermal conductivity of the non-stoichiometric rare-earth material is approximately 23 watts per meter-kelvin (W/(m*K)), which is a result of using $Y_2O_3$ as the non-stoichiometric rare-earth material. $Y_2O_3$ is preferably used as the non-stoichiometric rare-earth compound.

Figure 2:
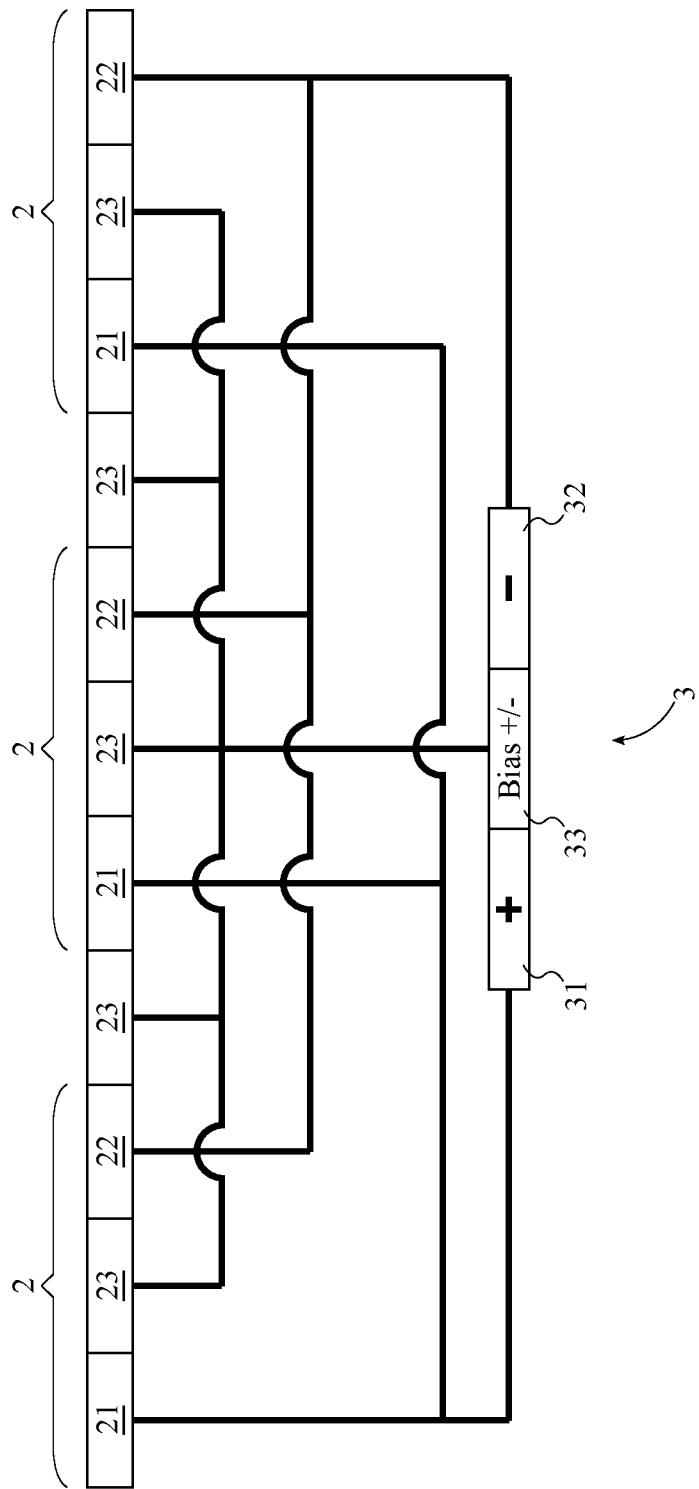
FIG. 2 is a diagram illustrating the electrical connections between the electrostatic field generating circuits and the capacitance charging interface for the MESC.

As can be seen in FIG. 2, the capacitance charging interface 3 is used to selectively charge or discharge the plurality of EFG circuits 2 by adding or depleting the positive pole 21 and the negative pole 22 of their respective electrical charges. The capacitance charging interface 3 will charge the plurality of EFG circuits 2 if the semiconductive wafer 6 needs to be bonded to the present invention. The capacitance charging interface 3 will also discharge the plurality of EFG circuits 2 if the semiconductive wafer 6 needs to be released from the present invention. The capacitance charging interface 3 comprises at least one positive terminal 31, at least one negative terminal 32, and at least one biasing terminal 33, all of which are mounted onto a second face 12 of the doped semiconductive substrate 1. This allows a temporary electrical connection to be made with the capacitance charging interface 3 from the bottom of the present invention while the semiconductive wafer 6 is held on the top of the present invention. The at least one positive terminal 31 is electrically connected to the positive poles 21 of the plurality of EFG circuits 2 so that electrical current can flow from the positive poles 21 to the capacitance charging interface 3 while charging the plurality of EFG circuits 2 and can flow from the capacitance charging interface 3 to the positive poles 21 while discharging the plurality of EFG circuits 2. Similarly, the at least one negative terminal 32 is electrically connected to the negative poles 22 of the plurality of EFG circuits 2 so that electrical current can flow from the capacitance charging interface 3 to the negative poles 22 while charging the plurality of EFG circuits 2 and can flow from the negative poles 22 to the capacitance charging interface 3 while discharging the plurality of EFG circuits 2. In addition, the at least one biasing terminal 33 is electrically connected to the biased pole 23 in order to allow electrical current to flow through the doped semiconductive substrate 1. In the preferred embodiment of the present invention, the at least one positive terminal 31, at least one negative terminal 32, and at least one biasing terminal 33 are mounted onto the second surface 12 of the doped semiconductive substrate 1 so that the capacitance charging interface 3 does not interfere with the positioning of the semiconductive wafer 6 on the first face 11 of the doped semiconductive substrate 1.

Figure 6:
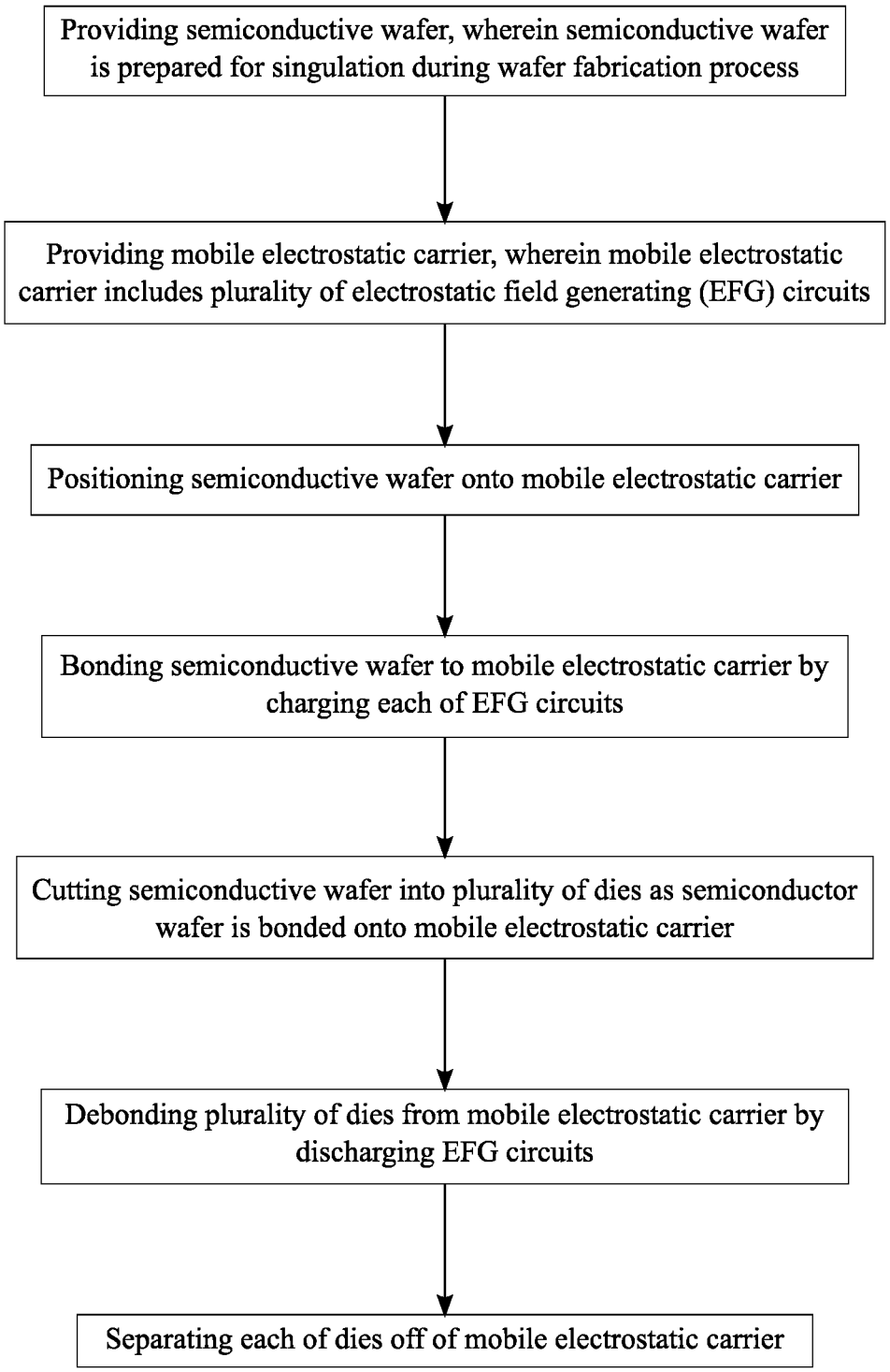
FIG. 6 is a flowchart illustrating how the MESC is used for singulation of a semiconductive wafer during a wafer fabrication process.

The present invention can also be used to make the wafer fabrication process more efficient during singulation of a semiconductive wafer. Typically, before singulation, an integrated circuit is copied and fabricated a number of times on a single piece of semiconductive wafer. Once a semiconductive wafer is prepared for singulation during the wafer fabrication process, the semiconductive wafer and the present invention are processed through the following steps, which are illustrated in FIG. 6. To begin, the semiconductive wafer is positioned onto the present invention in order to properly orient the semiconductive wafer for singulation. The semiconductive wafer is also bonded to the present invention by charging each of the plurality of EFG circuits 2, which holds the semiconductive wafer in place for singulation. These preliminary steps are completed so that the semiconductive wafer can be accurately and precisely cut into a plurality of dies, each of which is manufactured to be an individually functioning integrated circuit on a fractional piece of the semiconductive wafer. The plurality of dies is then debonded from the present invention by discharging the plurality of EFG circuits 2. This allows the plurality of dies to be loosely held on the present invention and consequently allows the plurality of dies to be separated from the present invention, which completes singulation during the wafer fabrication process. Once the present invention discharges the plurality of EFG circuits 2, a pick-and-place machine can typically be used pluck the plurality of dies of off the present invention. Other means common to the art of wafer fabrication can be implemented to separate the plurality of dies from the present invention.

The singulation of a semiconductive wafer is preferably accomplished by means of an etching tool in order to smoothly cut the semiconductive wafer into the plurality of dies. The etching tool is used to secure the present invention in place, which allows the positioning of the semiconductive wafer to remain constant during the mechanical cutting motions of the etching tool. The mechanical cutting motions of the etching tool are then used to etch a trench pattern into the semiconductive wafer so that the trench pattern delineates the divisions amongst the plurality of dies. Deep trenches within the semiconductive wafer is required for singulation, and, thus, the etching tool should be configured for deep reactive-ion etching.

The singulation of a semiconductive wafer requires only the primary mode of adhesion from the present invention, which is to use the electrostatic fields generated by the plurality of EFG circuits 2 to bond to the compositional impurities within the semiconductive wafer. The other modes of adhesion implemented by the present invention (such as intermolecular bonding between flat surfaces and removing trapped gas particles) can be done to further bond the semiconductive wafer to the present invention, but the other modes of adhesion are not necessary for the singulation of the semiconductive wafer.

Although the invention has been explained in relation to its preferred embodiment, it is to be understood that many other possible modifications and variations can be made without departing from the spirit and scope of the invention as hereinafter claimed.

What is claimed is:

1. A system for adhering a semiconductive wafer to an electrostatic carrier by adjusting relative permittivity comprises:
    an electrostatic carrier;
    a dielectric thin film;
    a polishing film;
    said dielectric thin film being superimposed onto a bonding surface of said electrostatic carrier;
    said dielectric thin film being made of a non-stoichiometric rare-earth compound;
    said rare-earth compound being a fluoridized compound;
    said electrostatic carrier being a mobile electrostatic carrier (MESC);
    said MESC comprises a doped semiconductive substrate, a plurality of electrostatic field generating (EFG) circuits, and a capacitance charging interface;
    said doped semiconductive substrate comprises a first face and a second face;
    each of said plurality of EFG circuits comprises a positive pole, a negative pole, and a biased pole;
    said plurality of EFG circuits being distributed across said doped semiconductive substrate;
    said positive pole and said negative pole being embedded into said doped semiconductive substrate from said first face;
    said positive pole and said negative pole being offset from each other across said first face;
    an exposed portion of said doped semiconductive substrate being located between said positive pole and said negative pole for each of said plurality of EFG circuits;
    said biased pole being said exposed portion of said doped semiconductive substrate;
    said capacitance charging interface being electrically connected to said positive pole, said negative pole, and said biased pole; and
    a thickness of said dielectric thin film being configured to proportionately tune said capacitance between said positive pole, said negative pole, and said biased pole;
    said polishing film being positioned in between said dielectric thin film and said bonding surface.

2. The system for adhering a semiconductive wafer to an electrostatic carrier by adjusting relative permittivity as claimed in claim 1, wherein said fluoridized compound is $YF_3$.

3. The system for adhering a semiconductive wafer to an electrostatic carrier by adjusting relative permittivity as claimed in claim 1, wherein a thermal conductivity of said non-stoichiometric rare-earth material is approximately 23 watts per meter-kelvin (W/(m*K)).

4. The system for adhering a semiconductive wafer to an electrostatic carrier by adjusting relative permittivity as claimed in claim 1 comprises:
    said capacitance charging interface comprises at least one positive terminal;
    said at least one positive terminal being electrically connected to said positive poles of said plurality of EFG circuits; and
    said at least one positive terminal being mounted onto said second face.

5. The system for adhering a semiconductive wafer to an electrostatic carrier by adjusting relative permittivity as claimed in claim 1 comprises:
    said capacitance charging interface comprises at least one negative terminal;
    said at least one negative terminal being electrically connected to said negative poles from said plurality of EFG circuits; and
    said at least one negative terminal being mounted onto said second face.

6. The system for adhering a semiconductive wafer to an electrostatic carrier by adjusting relative permittivity as claimed in claim 1 comprises:
    said capacitance charging interface comprises at least one biasing terminal;
    said at least one biasing terminal being electrically connected to said biased poles from said plurality of EFG circuits; and
    said at least one biasing terminal being mounted onto said second face.

7. The system for adhering a semiconductive wafer to an electrostatic carrier by adjusting relative permittivity as claimed in claim 1 comprises:
    said positive pole and said negative pole being flush with said exposed portions of said doped semiconductor substrate;
    a planarized surface being formed by said positive poles and said negative poles of said plurality of EFG circuits and said exposed portions of said doped semiconductor substrate; and
    said planarized surface being said bonding surface of said MESC.

8. The system for adhering a semiconductive wafer to an electrostatic carrier by adjusting relative permittivity as claimed in claim 1 comprises:
    an insulative film; and
    said insulative film being positioned between said positive pole and said doped semiconductive substrate.

9. The system for adhering a semiconductive wafer to an electrostatic carrier by adjusting relative permittivity as claimed in claim 1 comprises:
    an insulative film; and
    said insulative film being positioned between said negative pole and said doped semiconductive substrate.

10. The system for adhering a semiconductive wafer to an electrostatic carrier by adjusting relative permittivity as claimed in claim 1, wherein said doped semiconductive substrate is made of a p-type semiconductor material.

11. The system for adhering a semiconductive wafer to an electrostatic carrier by adjusting relative permittivity as claimed in claim 1, wherein said doped semiconductive substrate is made of an n-type semiconductor material.

* * * * *